United States Patent
Mikhailov et al.

(10) Patent No.: US 7,035,014 B2
(45) Date of Patent: Apr. 25, 2006

(54) DEVICE FOR COLLIMATING LIGHT EMANATING FROM A LASER LIGHT SOURCE AND BEAM TRANSFORMER FOR SAID ARRANGEMENT

(75) Inventors: Alexei Mikhailov, Dortmund (DE); Daniel Bartoschewski, Gelsenkirchen (DE)

(73) Assignee: Hentze-Lissotschenko, Norderfriedrickskoog (DE)

( * ) Notice: Subject to any disclaimer, the term of this patent is extended or adjusted under 35 U.S.C. 154(b) by 33 days.

(21) Appl. No.: 10/474,033

(22) PCT Filed: Apr. 12, 2002

(86) PCT No.: PCT/EP02/04081

§ 371 (c)(1),
(2), (4) Date: Oct. 14, 2003

(87) PCT Pub. No.: WO02/084377

PCT Pub. Date: Oct. 24, 2002

(65) Prior Publication Data

US 2004/0130793 A1    Jul. 8, 2004

(30) Foreign Application Priority Data

Apr. 18, 2001  (DE)  ............................ 101 18 788

(51) Int. Cl.
G02B 27/30  (2006.01)
G02B 27/10  (2006.01)

(52) U.S. Cl. .................. 359/641; 359/626; 359/619
(58) Field of Classification Search ................ 359/619, 359/623, 625, 626, 641, 621
See application file for complete search history.

(56) References Cited

U.S. PATENT DOCUMENTS

| | | | |
|---|---|---|---|
| 593,045 A * | 11/1897 | Cummings | 359/594 |
| 3,239,660 A | 3/1966 | Hall, Jr. | |
| 4,185,891 A | 1/1980 | Kaestner | |
| 5,151,790 A * | 9/1992 | Takatori et al. | 348/335 |
| 5,745,153 A * | 4/1998 | Kessler et al. | 347/241 |
| 5,793,783 A * | 8/1998 | Endriz | 372/31 |
| 6,075,648 A * | 6/2000 | Yamamoto et al. | 359/619 |
| 6,215,598 B1 | 4/2001 | Hwu | |
| 6,226,120 B1* | 5/2001 | Feldman | 359/399 |
| 6,377,410 B1* | 4/2002 | Wang et al. | 359/837 |
| 6,433,934 B1* | 8/2002 | Reznichenko et al. | 359/622 |
| 6,556,352 B1* | 4/2003 | Wang et al. | 359/641 |
| 2003/0206569 A1* | 11/2003 | Hirano et al. | 372/75 |
| 2004/0008744 A1* | 1/2004 | Okazaki et al. | 372/36 |
| 2004/0081396 A1* | 4/2004 | Komine et al. | 385/33 |
| 2004/0247011 A1* | 12/2004 | Okazaki et al. | 372/108 |

FOREIGN PATENT DOCUMENTS

| | | |
|---|---|---|
| DE | 19500513 | 7/1996 |
| DE | 19813127 | 10/1998 |

(Continued)

*Primary Examiner*—Ricky Mack
(74) *Attorney, Agent, or Firm*—Hoffman, Wasson&Gitler PC

(57) ABSTRACT

A device for collimating light emanating from a laser light source, including a laser light source with a plurality of substantially linear emission sources arranged next to each other in at least one row, and collimation means with a plurality of collimation elements which can collimate the light emanating from the emission sources in a direction (X) corresponding to the direction of the row. The device also includes a beam transformer which can respectively transform the light emanating from at least two emission sources in such a way that the light emanating from the at least two emission sources impinges precisely upon a collimation element and is collimated. The invention also relates to a beam transformer for one such device.

14 Claims, 3 Drawing Sheets

FOREIGN PATENT DOCUMENTS

| | | |
|---|---|---|
| DE | 19800590 | 7/1999 |
| DE | 19841285 | 6/2000 |
| DE | 10015245 | 10/2000 |
| DE | 19820154 | 7/2002 |
| JP | 07043643 | 2/1995 |
| WO | WO 99/35724 | 7/1999 |

* cited by examiner

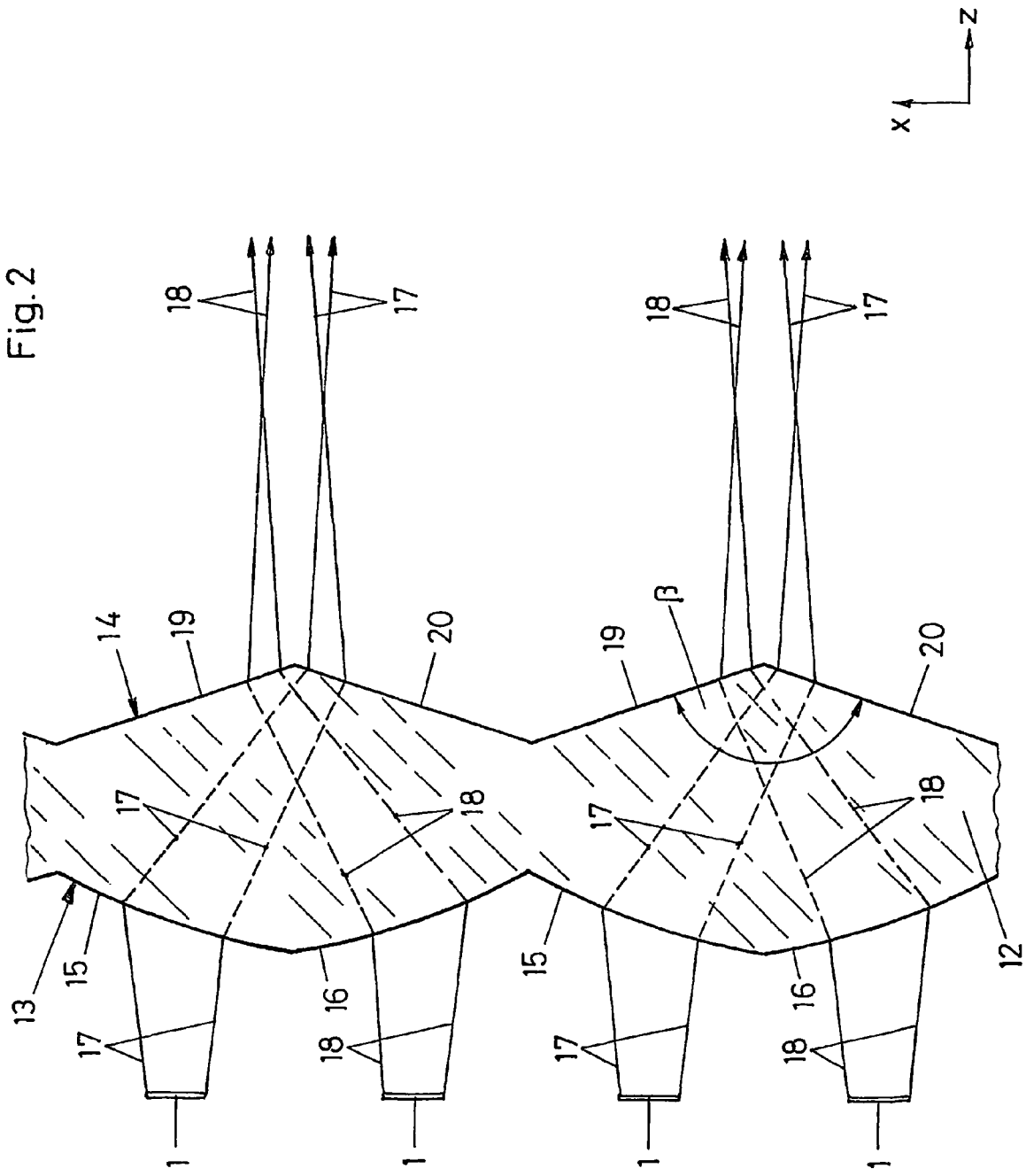

DEVICE FOR COLLIMATING LIGHT EMANATING FROM A LASER LIGHT SOURCE AND BEAM TRANSFORMER FOR SAID ARRANGEMENT

BACKGROUND OF THE INVENTION

This invention relates to an arrangement for collimation of light emanating from a laser light source, including a laser light source with a plurality of essentially linear emission sources, which are located in at least one row next to one another, and collimation means, with a number of collimation elements, these collimation elements being able to collimate the light emanating from the emission sources in the direction which corresponds to the direction of the row. Furthermore, this invention relates to a beam transformation device for one such arrangement.

An arrangement of the aforementioned type is suited for collimation of the light emanating from a laser diode bar. For collimation of the fast axis divergence of the light, emanating from the laser diode bar, a cylinder lens, which extends with its cylinder axis in the direction of the row of adjacent emission sources of the laser diode bar, can be used. For collimation of the slow axis divergence of the light, emanating from the laser diode bar, a cylinder lens array can be used, which has individual cylinder lens sections which are used as collimation elements, with cylinder axes aligned perpendicular to the direction of the row of emission sources. Since generally the emission sources of a laser diode bar are arranged equidistantly to one another, and at the same time, also the individual collimation elements of such a cylinder lens array are located equidistantly to one another, in the art, the light emanating from one of the emission sources is collimated by exactly one of the collimation elements with respect to the slow axis. Due to the fact, that there are very small distances between the individual emission sources of a laser diode bar, and the distances between the individual collimation elements must be chosen to be comparatively small, production engineering problems arise.

One object of this invention is to devise an arrangement of the initially mentioned type which enables a greater distance of the collimation elements to one another, at the same distance of individual emission sources of the laser light source to one another.

This object is achieved in that the arrangement includes a beam transformation device which can transform the light emanating from at least two emission sources, such that the light emanating from these at least two emission sources strikes exactly one collimation element and is collimated. In particular, the light emanating from exactly two emission sources will hit exactly one collimation element and is collimated by it. As a result of this beam transformation device, the distance of the individual collimation elements can thus be chosen to be twice as great as in arrangements from the existing art, so that the production costs for an arrangement are distinctly lower.

It can be provided that the collimation means include at least one lens for the collimation of the fast axis divergence and collimation elements for collimation of the slow axis divergence, here the beam transformation device being located between the aforementioned at least one lens intended for fast axis divergence and the collimation elements for slow axis divergence.

It can be provided that the collimation means include a cylinder lens array with cylinder lens sections which are used as collimation elements, with cylinder axes which extend especially in one direction and which are aligned perpendicular to the direction of the row and to the middle propagation direction of the light beams. These collimation means are used for collimation of the slow axis divergence of the light beams incident on it.

SUMMARY OF THE INVENTION

According to one preferred embodiment of this invention, the beam transformation device includes a structured entry surface and a structured exit surface which are made such that the light beams emanating from the adjacent emission sources in the beam transformation device are caused to approach one another in pairs. Depending on the alternative embodiments of the beam transformation device, the beams of the beam transformation device which have been caused to approach one another can cross or emerge from the exit surface only near one another without having crossed beforehand.

It can be provided that the entry surface and/or the exit surface are structured with cylinder lens sections which are made differently and which are located adjacent to one another and/or plane sections, with cylinder axes which extend especially in one direction and which are aligned perpendicular to the direction of the row and to the middle propagation direction of the light beams.

On the one hand, the cylinder lens sections and/or plane sections provided on the entry and exit surface are used to cause the light beams to approach one another, and this proximity can be achieved by different tilts of adjacent surfaces of the plane sections and/or the cylinder lens sections or in addition especially also by different radii of curvature of adjacent cylinder lens sections. These configurations, with means which are easy to implement, yield the advantages of a beam transformation device which especially causes two beams to essentially approach one another or combines them such that they can be collimated further by a collimation element.

Furthermore, by using the aforementioned cylinder lens sections on the entry and/or exit surface of the beam transformation device a certain precollimation of the light beams passing through the beam transformation device is caused so that the collimation elements located generally behind in the beam direction need induce only final collimation. In particular of course the following collimation elements must be matched to the cylinder lens sections provided in the beam transformation device.

BRIEF DESCRIPTION OF THE DRAWINGS

Other features and advantages of this invention become clear using the following description of preferred embodiments with reference to the attached drawings:

FIG. 2 shows a schematic side view of a second embodiment of the arrangement as claimed in the invention;

FIG. 3b shows a view according to the arrow IIIb in FIG. 3a.

DETAILED DESCRIPTION OF THE INVENTION

In all attached figures the coordinate axes of a Cartesian coordinate system X, Y, Z are shown for better clarity.

Figure 1:
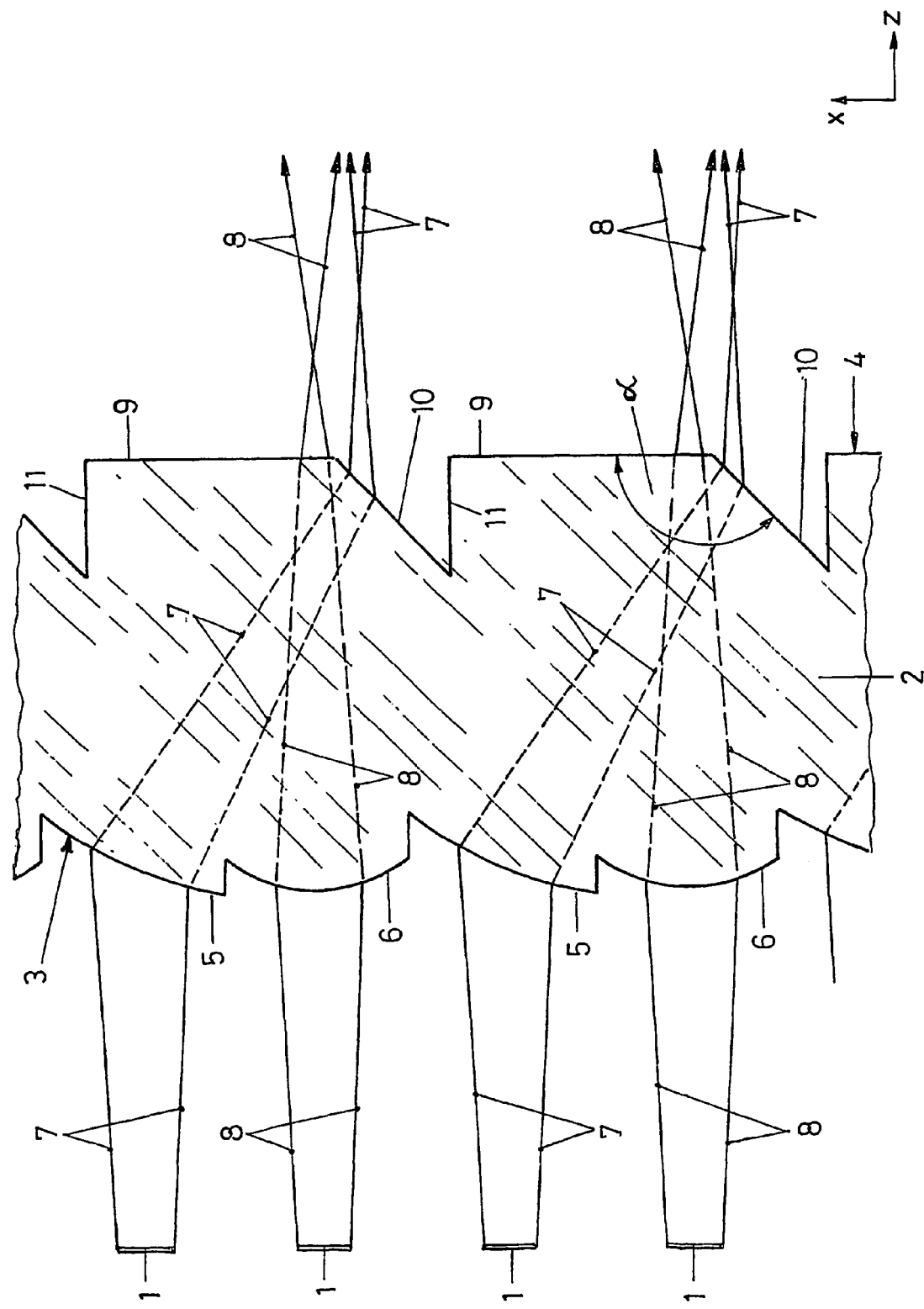
FIG. 1 shows a schematic side view of a first embodiment of the arrangement as claimed in the invention.

FIG. 1 shows linear emission sources 1 which are arranged in a row and in their entirety which can include much more than the four illustrated emission sources 1, represent a laser light source, especially a laser diode bar.

Furthermore, FIG. 1 shows a first beam transformation device 2 which is shown only schematically and which can be continued to the top and to the bottom in FIG. 1. The beam transformation device 2 includes a structured entry surface 3 and a structured exit surface 4. The entry surface 3 includes individual cylinder lens sections 5, 6 which are each located next to one another and which differ both by the radius of curvature of their surface and also by the tilt of their surface relative to the middle entry direction Z of the light beams 7, 8 emanating from the emission sources 1. In the illustrated embodiment, the cylinder axes of the cylinder lens sections 5, 6 extend in the Y direction and thus out of the plane of the drawing in FIG. 1. The cylinder lens sections 6 are not tilted, or are only hardly tilted, relative to the X direction so that the light beams 8, which enter the beam transformation device 2 through the cylinder lens sections 6, essentially retain their original direction which corresponds to the direction Z. Conversely, the cylinder lens sections 5, which are located next to the cylinder lens sections 6, are tilted relative to the X direction so that the light beams 7 which enter the beam transformation device 2 through these cylinder lens sections 6 are deflected on the entry surface 3 in the X direction which is negative in FIG. 1.

The exit surface 4 which is essentially opposite the entry surface 3 has plane sections 9 which extend in the XY plane and plane sections 10 which are located at an angle α relative to these sections. In the illustrated embodiment the angle α between the sections 9, 10 is 135°. As is apparent from FIG. 1, the section 9 adjoins a section 10 which runs to it at the angle α and which extends from the section 9 into the beam transformation device 2. On the end of the section 10 facing away from the aforementioned section 9, in the exit surface 4, a step 11 is formed which extends in the Z direction and which leads to the outside from the section 10 to the next section 9.

FIG. 1 furthermore shows that the light beams 7 entering the beam transformation device 2 through the cylinder lens sections 5 each emerge from the exit surface 4 underneath the connecting area between two plane sections 9, 10, conversely the light beams 8 which pass through the cylinder lens sections 6 each emerge above the connecting area between the two plane sections 9, 10. The light beams 7 cross the light beams 8 within the beam transformation device 2. Based on the fact that the light beams 7 each emerge from a plane section 10, conversely the light beams 8 emerge from the plane section 9 which is tilted by an angle of 135° relative to the respectively adjacent plane section 10, the light beams 7 undergo refraction which is different from the refraction which the light beams 8 undergo on the exit surface 4. It is apparent from FIG. 1 that the light beams 7, 8 which emerge above and below the connecting area of the two adjacent plane sections 9, 10 on the one hand emerge essentially in the same region of space from the exit surface 4 and on the other hand emerge essentially in the same direction, specifically roughly in the Z-direction, from the exit surface 4.

As a result of this combination of two light beams 7, 8 at a time which emanate from adjacent emission sources 1, it is possible to allow these two light beams 7, 8 which have been combined by the beam transformation device 2 which is used partially as collimation means to be incident in the collimation element of a lens array which is detailed below, which element is used as a further collimation means, for collimation of the slow axis divergence of the light emanating from the laser diode bar.

FIG. 2 shows another arrangement which includes a differently configured beam transformation device 12. This beam transformation device 12 has an entry surface 13 and an exit surface 14 opposite it. The entry surface 13 has cylinder lens sections 15, 16 which are located next to one another, with cylinder axes which extend in the Y direction and thus out of the plane of the drawings of FIG. 2. In the embodiment shown in FIG. 2, the cylinder lens sections 15, 16 have essentially the same curvature and are tilted by the same absolute angle relative to the X direction, in any case with different signs. As a result of this different tilting of the cylinder lens sections 15, 16 relative to the X direction, the light beam 17 entering through the cylinder lens section 15 is deflected down in the beam transformation device 12 in FIG. 2, conversely the light beam 18 entering through the cylinder lens section 16 is deflected up in the beam transformation device 12. The two aforementioned light beams 17, 18 cross one another in the beam transformation device 12 shortly before reaching the exit surface 14.

The exit surface 14 includes, similarly to the exit surface 4 shown in FIG. 1, plane sections 19, 20 which each include with one another an angle β of 135°. As is apparent from FIG. 2, the light beams 17 strike the plane section 20 shortly underneath the connecting area of the plane sections 19, 20, conversely the light beams 18 strike the plane section 19 shortly above the connecting area of the two plane sections 19, 20. As a result of the fact that the plane sections 19, 20 include with one another an angle β of for example 135°, the light beams 17, 18 are diffracted differently on the plane sections 19, 20 so that on the one hand they leave the beam transformation device 12 essentially in the same region of space and on the other essentially in the same direction which corresponds on average to the Z direction.

As was mentioned in conjunction with the embodiment shown in FIG. 1, in the embodiment as shown in FIG. 2 the beam transformation device 12 which is used partially as a collimation means combines two adjacent light beams 17, 18 such that they can strike a collimation element which is used as a further collimation means and which is detailed below.

Figure 3A:
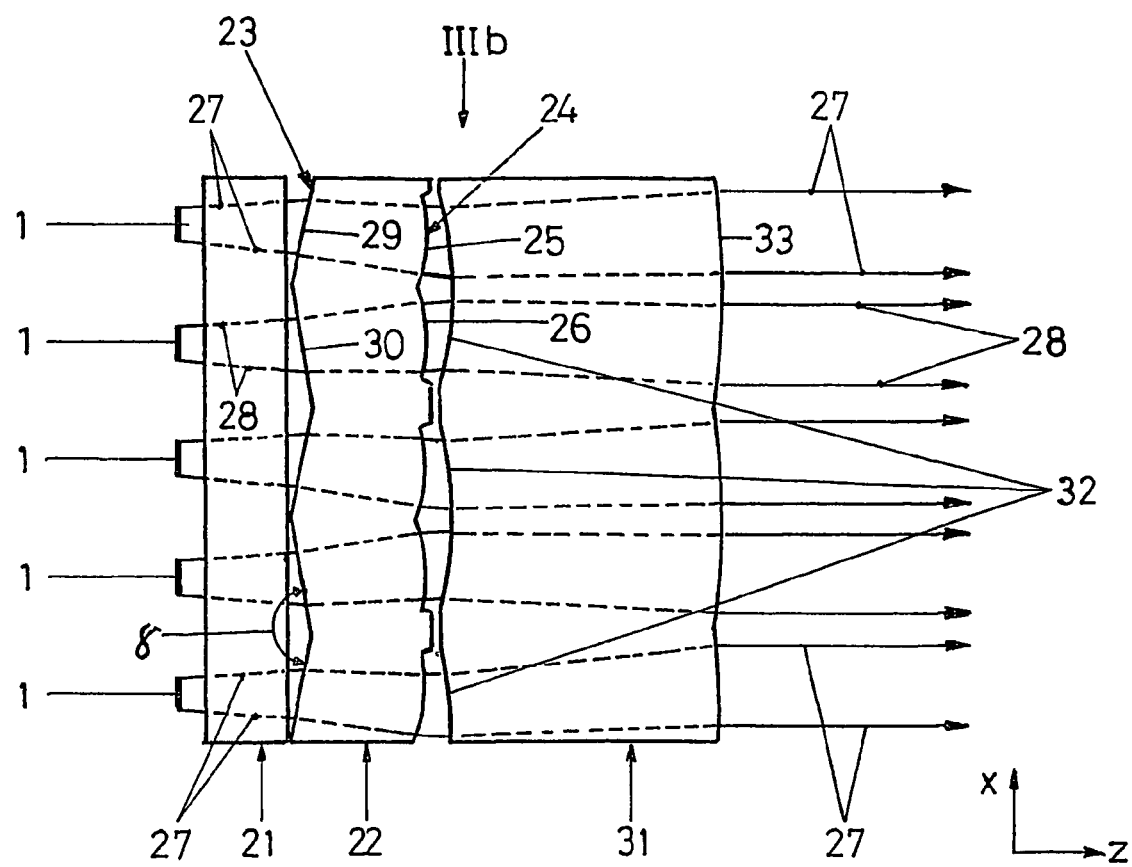
FIG. 3a shows a schematic side view of a third embodiment of the arrangement as claimed in the invention.
Figure 3B:
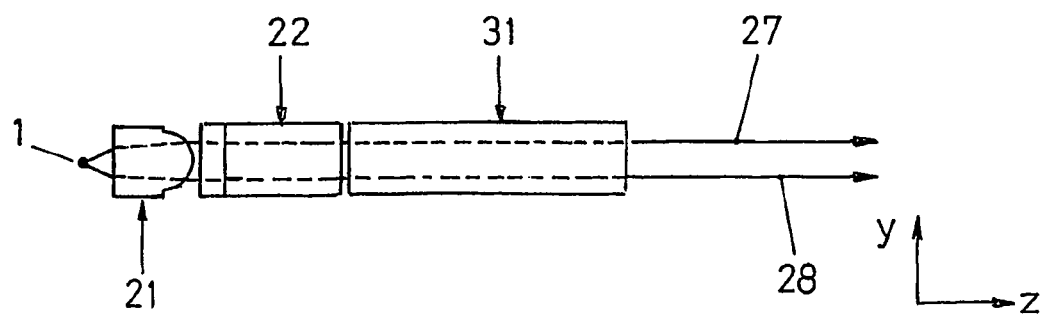

FIG. 3 shows a third embodiment of an arrangement in which a lens 21 which is used as a collimation means for collimation of the fast axis divergence is located between the emission sources 1 and a third embodiment of the beam transformation device 22. The lens 21 is made as a plano-convex cylinder lens in the embodiment shown, with a cylinder axis which extends in the X direction and thus in the direction of the row of emission sources 1 which are located next to one another. Collimation of the fast axis divergence which occurs in the laser diode bars takes place by this lens.

The beam transformation device 22 has an entry surface 23 and an exit surface 24, in any case the exit surface 24 including cylinder lens sections 25, 26 in the beam transformation device 22, conversely the entry surface 23 for refraction of the light beams 27, 28 includes plane sections 29, 30 which each include an angle γ with one another which is roughly 157.5° in the embodiment shown. At the same time, the two plane sections 29, 30 include an angle of roughly 12.5° or roughly −12.5° with the X direction. As is apparent from FIG. 3a, in the arrangement, the light beams 27, 28 emerging from adjacent emission sources 1 are incident on adjacent plane sections 29, 30. As a result of their tilt to one another or their tilt to the X direction the light beams 27, 28 are refracted on the entry surface 23 such that they are moved toward one another within the beam transformation device 22. But furthermore, on the one hand, the angle between the plane sections 29, 30 is configured such and at the same time the beam transformation device in the propagation direction, therefore in the Z-direction, is so short that the light beams 27, 28 of adjacent emission sources 1 do not cross in the beam transformation device 22. Rather, the light beams 27 each strike the cylinder lens section 25 above the connecting area of the two adjacent cylinder lenses 25, 26, conversely the light beam 28 strikes the cylinder lens section 26 underneath the connecting area of the cylinder section 25, 26. The cylinder lens sections 25, 26 each have the same focal length, their cylinder axes extending in the Y direction and thus out of the plane of the drawings from FIG. 3a. The cylinder lens sections 25, 26 are each slightly tilted against one another and against the X direction so that the beams 27, 28 passing through them after emerging from the exit surface 24 emerge closely adjacent to one another roughly in the same direction, specifically in the Z direction, the two beams 27, 28 also after emerging from the beam transformation device 22 running still slightly at one another. The opposing and interacting plane sections 29, 30 and cylinder lens sections 25, 26 are aligned to one another such that the light beams 27, 28 emerging from the exit surface 24 focus on a common focal point which in the Z direction is located far behind the lens array 31 which is detailed below. The beam transformation device 22 is thus used in part as collimation means for the light beams 27, 28, because the slow axis divergence after passing through the beam transformation device 22 is cancelled such that the beams focus on a focal point which is far away in the Z direction.

FIG. 3 shows the lens array 31 which is used as another collimation means and which is located in the Z direction behind the beam transformation device 22 and on its side facing the beam transformation device 22 includes cylinder sections 32 of the same focal length with cylinder axes which are aligned in the Y direction. These cylinder lens sections 32 each form collimation elements for two light beams 27, 28 which are focused on the aforementioned focal point and which emerge from the cylinder lens sections 25, 26 of the beam transformation device 22, which sections 25, 26 lie next to one another. Here the cylinder lens sections 32 are made concave, so that the slightly focused light beams 27, 28 are again widened. On the opposite exit surface of the lens array 31 furthermore there can be convex cylinder lens sections 33 which are likewise shown in FIG. 3a.

FIG. 3a shows that the collimation elements which are formed by these cylinder lens sections 32, 33 collimate the light beams 27, 28 passing through them together with the beam transformation device 22 with respect to slow axis divergence such that the light beams 27, 28 after emerging from the lens array 31 run essentially parallel to one another with respect to the X direction.

Instead of the cylinder lens sections 5, 6, 15, 16, 25, 26 which were mentioned in the embodiments named above, cylinder lens-like sections with an aspherical contour can be used. Furthermore, in the arrangements which are shown in FIGS. 1 and 2 there can be lenses for collimation of fast axis divergence between the emission sources 1 and the respective beam transformation devices 2, 12. Furthermore, the light emerging from the beam transformation devices 2, 12 can accordingly enter the collimation elements for slow axis divergence.

The light emerging from the corresponding collimation elements can be focused with means known from the existing art, for example, onto the entry end of an optical fiber.

The invention claimed is:

1. An arrangement for collimation of light emanating from a laser light source, comprising a laser light source with a plurality of essentially linear emission sources which are located in at least one row next to one another, and collimation means with a number of collimation elements, the collimation elements being able to collimate the light emanating from the emission sources in the direction (X) which corresponds to the direction of the row, a beam transformation device which can transform the light emanating from at least two emission sources such that the light emerging from these at least two emission sources strikes exactly one collimation element of said collimation means and is collimated wherein the collimation means comprise at least one lens for the collimation of a fast axis divergence and collimation elements for collimation of a slow axis divergence and the beam transformation device is located between said at least one lens for fast axis divergence and the collimation elements for slow axis divergence.

2. The arrangement as claimed in claim 1, wherein the collimation means comprise a cylinder lens array with cylinder lens sections which are used as collimation elements, with cylinder axes which extend especially in one direction (Y) and which are aligned perpendicular to the direction of the row and to the middle propagation direction of light beams.

3. The arrangement as claimed in claim 1, wherein the collimation elements are located next to one another in the direction (X) corresponding to the row.

4. The arrangement as claimed in claim 1, wherein the laser light source is a laser diode bar.

5. A beam transformation device for an arrangement as claimed in claim 1.

6. An arrangement for collimation of light emanating from a laser light source, comprising a laser light source with a plurality of essentially linear emission sources which are located in at least one row next to one another, and collimation means with a number of collimation elements, these collimation elements being able to collimate the light emanating from the emission sources in the direction (X) which corresponds to the direction of the row, wherein the arrangement comprises a beam transformation device which can transform the light emanating from at least two emission sources such that the light emerging from these at least two emission sources strikes exactly one collimation element and is collimated wherein the beam transformation device comprises a structured entry surface and a structured exit surface which are made such that light beams emanating from the adjacent emission sources in the beam transformation device are caused to approach one another in pairs.

7. The arrangement as claimed in claim 6, wherein the entry surface and/or the exit surface are structured with cylinder lens sections and/or plane sections which are made differently and which are located adjacent to one another, with cylinder axes which extend especially in one direction (Y) and which are aligned perpendicular to the direction of the row and to the middle propagation direction of the light beams.

8. The arrangement as claimed in claim 7, wherein on the entry surface there are cylinder lens sections, conversely on the exit surface there are plane sections.

9. The arrangement as claimed in claim 8, wherein the cylinder lens sections of the entry surface which are each located next to one another have a different radius of curvature and a different tilt relative to the middle entry direction of the light beams emanating from the emission sources.

10. The arrangement as claimed in claim 8, wherein the cylinder lens sections of the entry surface have the same radius of curvature and a different tilt to the middle entry direction of the light beams emanating from the emission sources.

11. The arrangement as claimed in claim 8, wherein in the direction (X) corresponding to the direction of the row of emission sources the plane sections of the exit surface which are adjacent to one another include an angle ($\alpha$, $\beta$) with one another and thus have a different tilt to the exit direction of the light beams which pass through the beam transformation device.

12. The arrangement as claimed in claim 7, wherein on the entry surface there are plane sections which are adjacent in pairs in the direction (X) corresponding to the direction of the row and which include an angle ($\gamma$) with one another.

13. The arrangement as claimed in claim 12, wherein on the exit surface of the beam transformation device in the direction (X) which corresponds to the direction of the row there are cylinder lens sections next to one another, with radii of curvature which are the same and which are slightly tilted against one another.

14. An arrangement for collimation of light emanating from a laser light source, comprising a laser light source with a plurality of essentially linear emission sources which are located in at least one row next to one another, and collimation means with a number of collimation elements, these collimation elements being able to collimate the light emanating from the emission sources in the direction (X) which corresponds to the direction of the row, wherein the arrangement comprises a beam transformation device which can transform the light emanating from at least two emission sources such that the light emerging from these at least two emission sources strikes exactly one collimation element and is collimated, wherein light beams which enter through adjacent cylinder lens sections cross one another within the beam transformation device and leave through plane sections which are adjacent to one another on the opposing side of the beam transformation device.

* * * * *